(12) United States Patent
Heston et al.

(10) Patent No.: US 7,095,285 B1
(45) Date of Patent: Aug. 22, 2006

(54) METHOD AND SYSTEM FOR BIASING POWER AMPLIFIERS WITH KINK ANOMALY

(75) Inventors: David D. Heston, Dallas, TX (US); John G. Heston, Murphy, TX (US); Brian P. Helm, Sachse, TX (US); Gordon R. Scott, Plano, TX (US); Scott Mitchel Heston, Dallas, TX (US); David R. Fletcher, Allen, TX (US); William S. Kopp, Greensboro, NC (US)

(73) Assignee: Raytheon Company, Waltham, MA (US)

( * ) Notice: Subject to any disclaimer, the term of this patent is extended or adjusted under 35 U.S.C. 154(b) by 51 days.

(21) Appl. No.: 10/901,416

(22) Filed: Jul. 26, 2004

(51) Int. Cl.
    *H03F 3/04* (2006.01)
(52) U.S. Cl. .................................................. 330/296
(58) Field of Classification Search ................ 330/296, 330/285, 310; 30/133
    See application file for complete search history.

(56) References Cited

U.S. PATENT DOCUMENTS 6,759,906 B1 * 7/2004 Matsunaga et al. ......... 330/285
6,943,631 B1 * 9/2005 Scherrer et al. ............ 330/310

\* cited by examiner

*Primary Examiner*—Robert Pascal
*Assistant Examiner*—Hieu Nguyen
(74) *Attorney, Agent, or Firm*—Baker Botts L.L.P.

(57) ABSTRACT

According to one embodiment of the present invention a method for biasing a power amplifier having at least one transistor exhibiting kink anomaly includes providing a bias circuit coupled to a gate of at least one transistor of the power amplifier. The method also includes providing, by the bias circuit, a bias voltage to the gate. The bias circuit has a load characteristic that intersects a current versus gate voltage curve for the gate at a frequency of operation of the power amplifier only once and that exhibits a low impedance at the intersection of the load characteristic with the current versus gate curve of the gate.

14 Claims, 4 Drawing Sheets

$V_g = V_{eq} - I_g \ast R_{eq}$
$V_{eq} = -0.55v, R_{eq}$

METHOD AND SYSTEM FOR BIASING POWER AMPLIFIERS WITH KINK ANOMALY

GOVERNMENT RIGHTS

This invention was made with Government support under Naval Sea Systems Command (NAVSEA) Grant No. N00024-99-C-5110 CEC FY03 Production. The government may have certain rights in this invention.

TECHNICAL FIELD OF THE INVENTION

The invention relates generally to power amplifiers and more particularly to a method and system for biasing power amplifiers having kink anomaly.

BACKGROUND OF THE INVENTION

Many high power amplifier monolithic microwave integrated circuits (MMICS) at microwave frequencies use GaAs pHEMT transistors. Under compression these power amplifier MMICs can pull gate current due to break down effects, rectification current, or "kink" effect current. The GaAs pHEMT structure built by many of the GaAs foundaries have an anomaly known as "kink" in the current-voltage curves of the gate of the transistor. This "kink" anomaly, renders difficult operation of a transistor at a particular gate voltage, because the load line of an associated bias circuit may intersect the gate current versus voltage curve at more than one location. Other technologies also exhibit this "kink" effect, including a relatively new technology involving GaN.

Known attempts to address the known "kink" problem include using resistor dividers with significantly higher current levels. This results in a load line for the bias circuit that avoids the kink in the gate current versus voltage curve. A problem with this approach is that it pulls more current from the supply voltage, which is not necessarily desirable. It is also sometimes possible to use a digital to analog converter to set the gate voltage to the power amplifier, but this requires an entire application specific integrated circuit (ASIC) to provide gate bias, which can be costly.

Most attempts to address the current-voltage kink and the impact to device performance focus on material science to try and remove the "kink" anomaly from the transistor. These approaches involve changing the doping profile of the transistor and changing the material structure of the transistor.

SUMMARY OF THE INVENTION

According to one embodiment of the present invention a method for biasing a power amplifier having at least one transistor exhibiting kink anomaly includes providing a bias circuit coupled to a gate of at least one transistor of the power amplifier. The method also includes providing, by the bias circuit, a bias voltage to the gate. The bias circuit has a load characteristic that intersects a current versus gate voltage curve for the gate at a frequency of operation of the power amplifier only once and that exhibits a low impedance at the point of intersection of the load characteristic with the current versus gate voltage curve of the gate.

Some embodiments of the invention provide numerous technical advantages. Some embodiments may exhibit some, none, or all of these advantages. For example, in one embodiment of the invention, a stable operating gate voltage point may be established across a range of operating frequencies because the kink in the gate current-voltage curves in the associated transistors in the power amplifier is avoided. This may occur without draining power from the voltage supply, which is undesirable in some applications. Further such avoidance of the kink may result without modification of the underlining active semiconductor device.

Other technical advantages will be readily obtainable to one skilled in the art.

BRIEF DESCRIPTION OF THE DRAWINGS

A more complete understanding of example embodiments of the invention will be apparent from the detailed description taken in conjunction with the accompanying drawings in which.

DETAILED DESCRIPTION OF THE DRAWINGS

Example embodiments of the invention are best understood by referring to FIGS. 1A through 4 of the drawings, like numerals being used for like and corresponding parts of the various drawings.

Figures 1A, 1B:
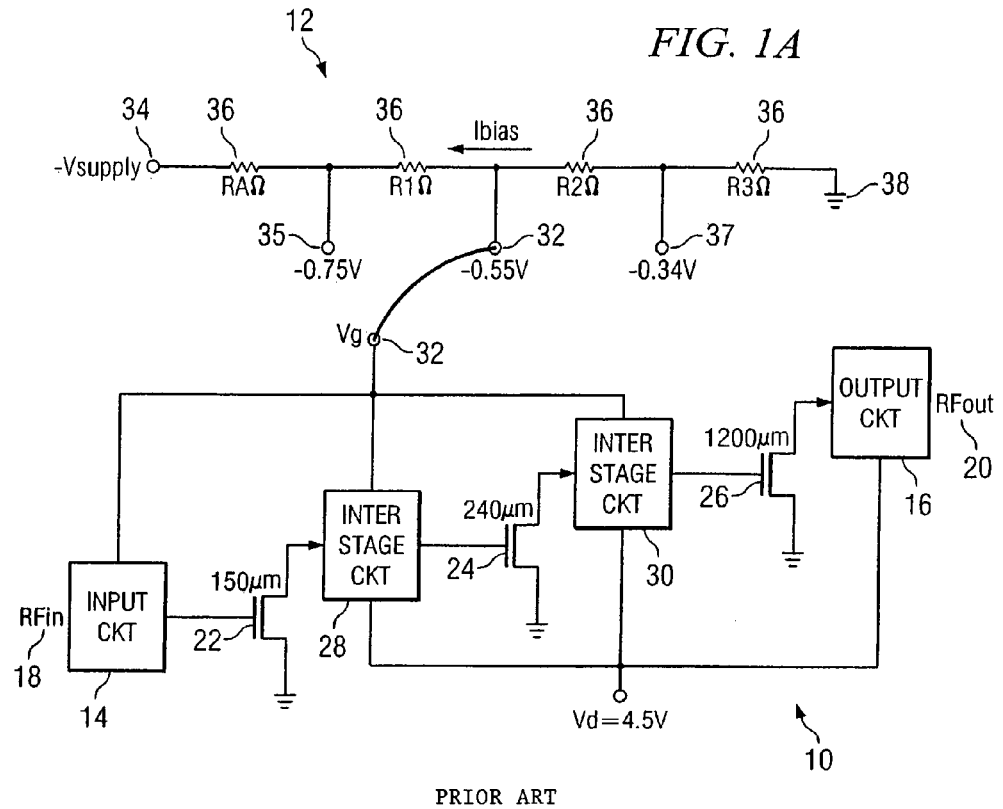
FIG. 1A is a schematic diagram of a conventional power amplifier with an associated bias circuit.
FIG. 1B is a graph showing gate current versus gate voltage for a plurality of voltage levels for a transistor of the power amplifier of the FIG. 1A.

FIG. 1A illustrates a conventional power amplifier 10 and associated bias circuit 12. Power amplifier 10 includes, in this example, a input circuit 14 and an output circuit 16, which receive a radio frequency input signal 18 and produce a radio frequency output signal 20, respectively. In other embodiments, other frequency signals may be received and generated. In this example, power amplifier 10 comprises a plurality of stages, each including a transistor, such as transistor 22, transistor 24, and transistor 26. This example illustrates a three stage design, but any suitable number of stages may be used. Between each stage is included inter-stage circuitry 28 and 30, which includes appropriate circuitry for effecting the purpose of power amplifier 10. In this example, transistor 22 has a gate width of 150 micro meters; transistor 24 has a gate width of 240 micro meters; and transistor 26 has a gate width of 1200 micro meters. However, any suitable sized transistors may be used as appropriate for the circumstance. Each of the gates of transistors 22, 24, and 26 are controlled by a gate voltage 32, which in this example is common to transistors 22, 24, and 26; however, separate gate voltages may be utilized to control each transistor. Although illustrated as passing through input circuitry 14, interstage circuitry 28, and interstage circuitry 30, a gate voltage 32 may be directly applied to each of the gates of transistors 22, 24, and 26.

Bias circuit 12 comprises a voltage supply 34 with a plurality of resistors 36 disposed in series between voltage supply 34 and a reference voltage 38, which in this example is ground. Bias circuit 12 can be either "off chip" or on the power amplifier MMIC. Resistors 36 act to split supply voltage 34 to an appropriate level, resulting in a desired gate voltage at node 32. In this example, four resistors are utilized, which results in a voltage level of −0.55 volts being applied at node 32. Resistors 36 are sized to achieve their desired gate voltage. Bias circuit 12 may be connected to power amplifier 10 by either a permanent chip connection or external inter-connect, such as a bond wire, or other suitable technique. In this manner, gate bias of circuit 12 may provide an appropriate voltage at node 32 to control the gates of transistors 22, 24, and 26. As illustrated, the same bias voltage may be provided to each transistor 22, 24, 26 or alternatively optional voltage taps 35 and 37 may also be used to supply various values of gate voltages to power amplifier 10.

FIG. 1B illustrates a gate current versus gate voltage curve for transistors 22, 24, and 26 of power amplifier 10. As illustrated, at certain levels of gate voltage, a "kink" occurs in the current versus voltage curve, dipping the gate current at approximately −0.2 to −0.5 volts. Typically the gate current versus voltage response varies with applied drain voltage, power amplifier load, frequency, drive level, and other factors but the general character of the "kink" may be seen. In general, the peak of the "kinked" curve moves to a more negative voltage with increasing drive levels. The illustrated curves show varying levels of compression and demonstrate that, in this example, significant kinks occur with compression levels of 1 db and higher. The deleterious effects of such kinks are described in greater detail in conjunction with FIGS. 2A through 2D.

Figure 2A:
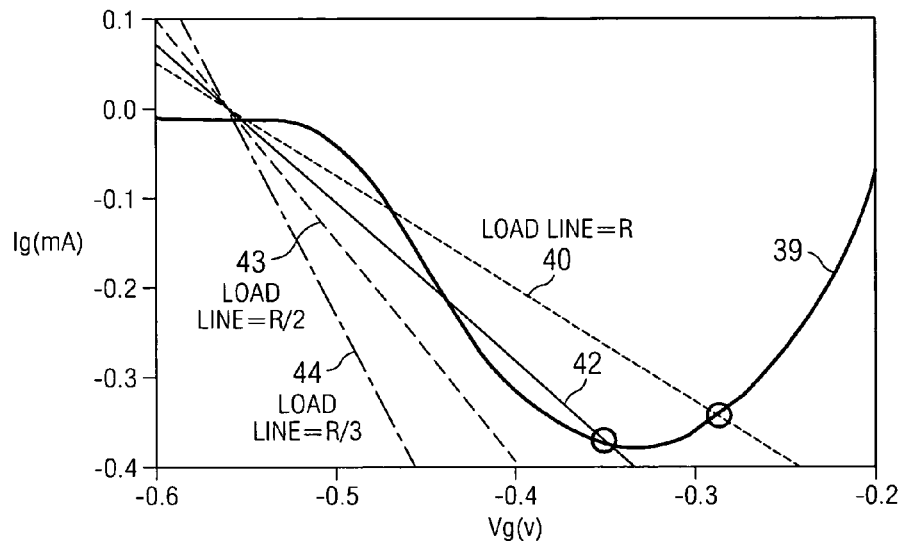
FIG. 2A is a graph of gate current versus voltage current for a typical transistor suffering kink anomaly, along with a plurality of load lines, showing the intersections of the load lines with the current versus voltage curve.

FIG. 2A is a graph of gate current versus voltage curve 39 for a typical transistor in amplifier 10 such as transistor 22, 24, or 26, operating at a single frequency. Also illustrated are a plurality of load lines representative of a load characteristic for bias circuit 10. As illustrated, for certain load lines, such as load lines 40 and 42, they intersect the gate current versus gate voltage curve at more than one point. This results in unstable operation of the transistor, and typically the power amplifier selects for operation the intersection point that corresponds to the lowest real impedance. Thus, rather than operating at a desired point near −0.55 volts, operation occurs for load line 40 near −0.28 volts and for load line 42 near −0.35 volts. By contrast, load lines 43 and 44, which correspond to impedances of ⅓ and ½ that of load line 40, respectively, only intersect the gate current versus gate voltage curve once, and thus avoid the kink in that curve. Although lower impedance load lines may avoid the kink region, they also would tend to pull more current from voltage supply 34, which is often not desirable.

Figure 2B:
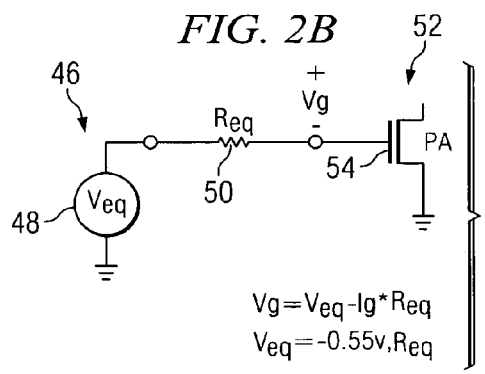
FIG. 2B is a Thevenin equivalent circuit for the gate bias circuit of FIG. 1A and power amplifier.

FIG. 2B is a Thevenin equivalent circuit for the bias circuit 10 of FIG. 1A. Thevenin circuit 46 includes an equivalent voltage source 48 and equivalent resistance 50 for bias circuit 12. The other portions of FIG. 2B represent a Thevenin equivalent circuit 52 for power amplifier 12, including the single device 54. Equivalent circuit 46 corresponds to a load line 56 in FIG. 2C.

Figure 2C:
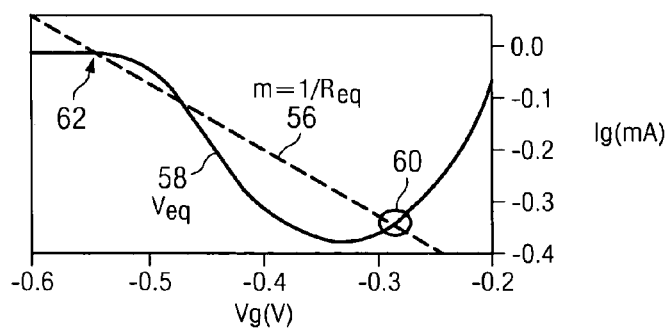
FIG. 2C is a graph of gate current versus voltage current for a typical transistor of the power amplifier of FIG. 1A, along with the load line for the Thevenin equivalent circuit of FIG. 2B for the bias circuit.

FIG. 2C is a graph of gate current versus voltage current for a single operating frequency. The operating point for the power amplifier 12, for the conditions shown in FIG. 2C, is the intersection of the bias load line 54 and the device gate current versus voltage curve 58. Because more than one intersection occurs, the bias voltage will stabilize at the point of lowest real impedance, which is denoted at reference numeral 60. This occurs despite the fact that the desired power amplifier gate bias point occurs at point 62 in FIG. 2C, which is approximately −0.55 volts.

Figure 2D:
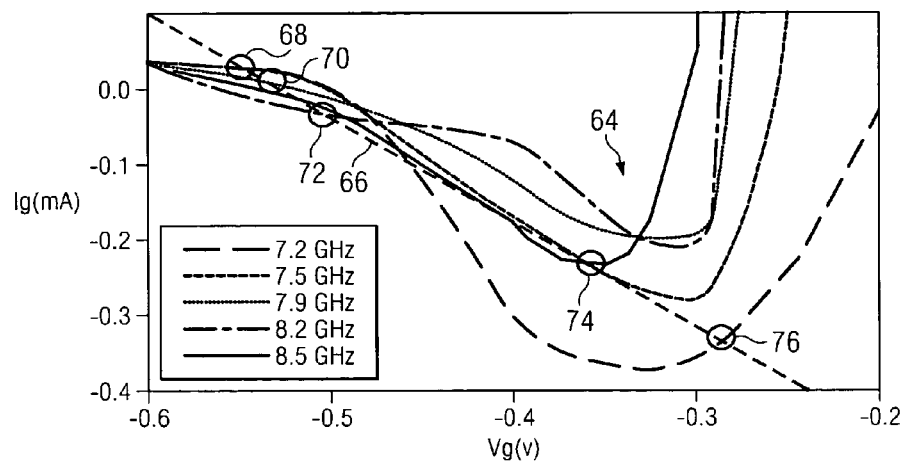
FIG. 2D is a graph of gate current versus gate voltage for a typical transistor of the power amplifier of FIG. 1A operating at a plurality of different frequencies, along with a bias circuit load line.

FIG. 2D is a graph of gate current versus gate voltage for a plurality of operating frequencies showing different kinks that occur in the gate current versus gate voltage characteristic at different operating frequencies. FIG. 2D includes curves 64 representing the gate current versus gate voltage for a transistor in power amplifier 10 at various indicated operating frequencies. Also illustrated is a load line 66 for bias circuit 12. Indicated are a plurality of intersections 68, 70, 72, 74, and 76 illustrating intersections between load line 66 and the various gate current versus gate voltage curves 64. Each of these intersections shows the stable operation point at each corresponding frequency. As illustrated, the operating point moves substantially across frequency from approximately −0.55 volts to −0.28 volts, which is very undesirable.

According to the teachings of the invention the kinks in the gate current versus gate voltage curves are avoided, resulting in stable operation of the power amplifier and a relatively constant bias voltage that varies little with operating frequency. This is accomplished, in one embodiment, by use of a diode in the bias circuit, as described in greater detail below in conjunction with FIGS. 3A and 3B.

Figure 3A:
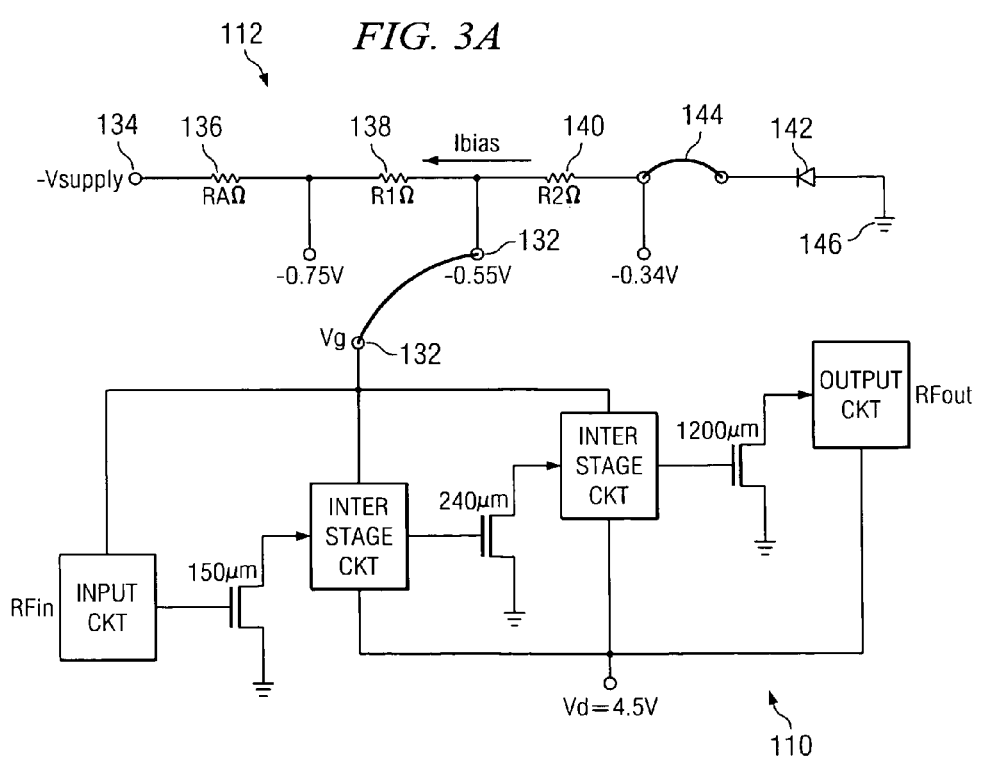
FIG. 3A is a schematic diagram of a power amplifier and a gate bias circuit according to the teachings of the invention.

FIG. 3A is a circuit diagram showing a power amplifier 110 and bias circuit 112 according to the teachings of the invention. Power amplifier 110 includes the same components as power amplifier 10, illustrated in FIG. 1A, but receives a bias voltage at node 132 from bias circuit 112 that results in stable operation at a given gate voltage regardless of frequency of operation of the circuit. This is achieved by creating a load characteristic for bias circuit 112 that has a relatively low impedance level near the desired operating point. Such a load characteristic avoids the kinks associated with the gate current versus gate voltage curves of the corresponding transistors in power amplifier 110.

The components of power amplifier 110 are not described here because they are substantially similar to the components of power amplifier 10. Bias circuit 112, in this embodiment, includes a power supply 134, a resistor 136, a resistor 138, a resistor 140, and a diode 142. Diode 142 is connected, in this embodiment, to one end of resistor 140 by a wire bond 144. In this example, one end of diode 142 is coupled to a reference voltage 146, which in this example is ground. The use of diode 142 reduces the impedance of gate bias network 112 at the desired bias point. This results in the load line 148, illustrated in FIG. 3B.

Figure 3B:
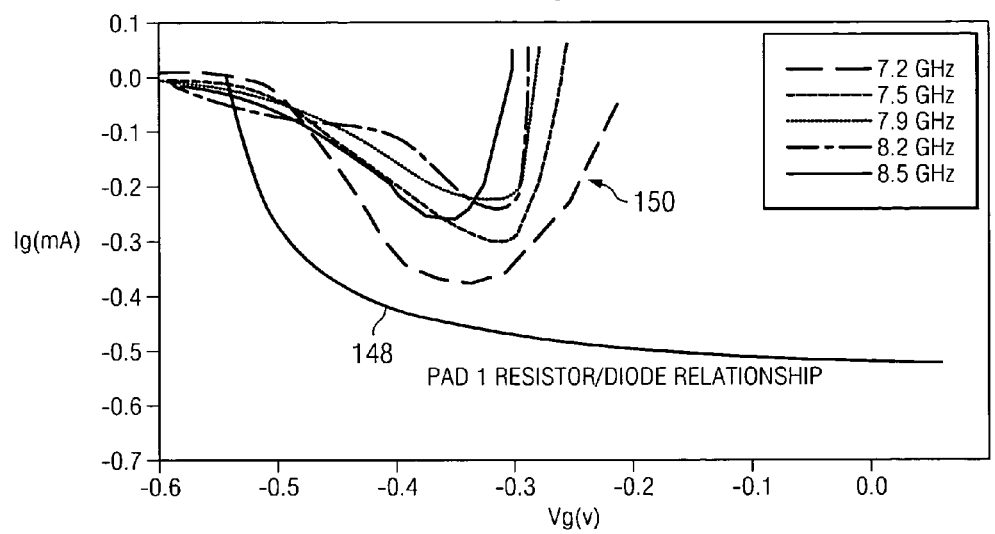
FIG. 3B is a graph showing a load line for the bias circuit of FIG. 3A according to the teachings of the invention in association with a plurality of gate current versus gate voltage curves for a transistor in the power amplifier of FIG. 3A.

FIG. 3B is a graph illustrating gate current versus gate voltage curves 150 for power amplifier 110 along with the load characteristic 148 of bias circuit 112. The different curves 150 correspond to various operating frequencies. As illustrated in FIG. 3B load line 148 crosses all curves 150 at only one location and at approximately the same location, near −0.55 volts, which is desirable. This is due to the near vertical nature of load line 148 as it intersects curves 150. Because of the low impedance at the desired operating point resulting from use of diode 142, load line 148 does not intersect the kinked portion of curves 150. Thus, according to the teachings of the invention, by providing a bias circuit that results in a reduced impedance, kinks in the corresponding gate versus voltage curves of the associated transistor may be avoided, which in turn creates a single intersection between load line 148 and curves 150.

Referring back to FIG. 3A, a diode technology used for diode 142 can be selected to provide the needed voltage level. A Ge diode has an approximately 0.3 volt knee; a silicon diode has a knee voltage of about 0.5 volts; a GaAs diode has a knee voltage of about 0.75 volts; and GaN diodes may be used as well. Diode 142 may be integrated on the MMIC or may be connected by wire bond 144, as illustrated. Other diodes of the same or different technologies could be stacked to provide desired knee voltages. In this example, a Ge diode is utilized, resulting in a approximately –0.34 volts at one end of resistor 140 and a desired –0.55 volts at the other. This results in a bias voltage of –0.55 volts, which is desirable in this particular application.

Figure 4:
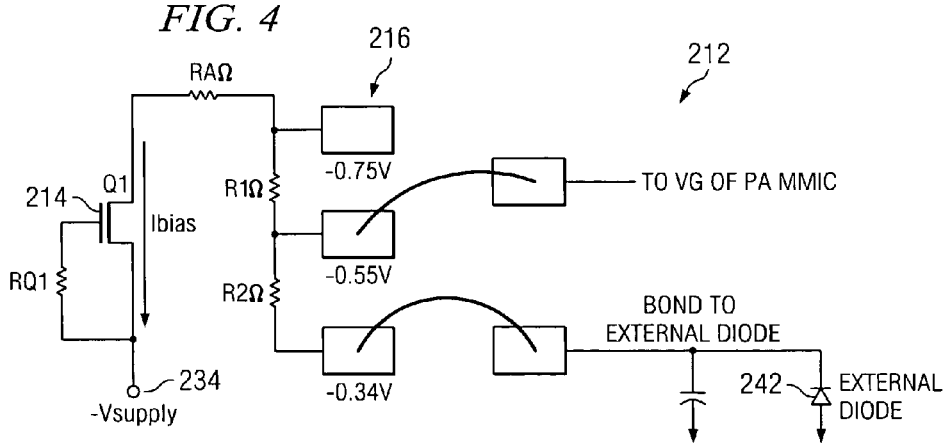
FIG. 4 illustrates the use of a voltage regulator in combination with the bias circuit of FIG. 3A, according to the teachings of the invention.

FIG. 4 is a circuit diagram illustrating the use of a voltage regulator 214 within an alternative bias circuit 212 incorporating the teachings of the invention. As illustrated, a voltage regulator 214 is utilized between voltage taps 216 and supply voltage 234. This approach not only stabilizes the gate bias voltage level in the presence of kinks, but may also provides temperature compensation for the associated power amplifier (not explicitly shown). This is because the associated bias circuit 212 with diode 242 changes over temperature in a manner that offsets the uncompensated temperature change of the power amplifier.

Although the present invention and its advantages have been described in detail, it should be understood that various changes, substitutions, and alterations can be made therein without departing from the spirit and scope of the invention as defined by the appended claims.

What is claimed is:

1. A method for biasing a power amplifier having at least one transistor exhibiting kink anomaly comprising:
    providing a bias circuit coupled to a gate of the at least one transistor of the power amplifier; and
    providing, by the bias circuit, a bias voltage to the gate, the bias circuit having a load characteristic that intersects a current versus voltage curve for the gate at a frequency of operation of the power amplifier only once and that exhibits a low impedance at the intersection of the load characteristic with the current versus voltage curve of the gate.

2. The method of claim 1, wherein providing a bias voltage, comprises providing a bias voltage by a bias circuit comprising a diode connected in series with at least one resistor between a supply voltage and a reference voltage.

3. The method of claim 1, wherein the frequency of operation of the power amplifier is in the range of 7.0 to 9.0 GHz.

4. The method of claim 1, wherein the intersection of the load characteristic of the bias circuit with the current versus voltage curve of the gate at the frequency of operation of the power amplifier occurs at a gate voltage of between –0.6 and –0.5 volts.

5. The method of claim 1, wherein the bias voltage is approximately –0.55 volts.

6. The method of claim 2, wherein a voltage drop across the diode is approximately –0.34 volts.

7. The method of claim 1, wherein the at least one transistor comprises a plurality of transistors.

8. The method of claim 1, wherein the at least one bias circuit comprises a plurality of resistors.

9. A circuit comprising:
    a power amplifier comprising at least one transistor having a gate;
    a bias circuit coupled to the gate and comprising at least one resistor and at least one diode connected in series; and
    wherein the bias circuit has a load characteristic that intersects a current versus voltage curve of the gate only once at a frequency of operation of the power amplifier and that exhibits a low impedance at gate voltages near zero and a greater impedance at the intersection of the load characteristic with the current versus voltage curve of the gate.

10. The circuit of claim 9, wherein the at least one resistor comprises three resistors connected in series with a supply voltage and the at least one diode.

11. The circuit of claim 10, wherein the three resistors comprise first, second, and third resistors and the third resistor is coupled at one end to the diode and wherein the bias circuit is coupled to the gate at a second end of the third resistor.

12. The circuit of claim 9, wherein the bias circuit is operable to provide a bias voltage to the gate of approximately –0.55 volts.

13. The circuit of claim 9, wherein the at least one diode is connected to the at least one resistor by a bond wire.

14. The circuit of claim 9, wherein the bias circuit further comprises a voltage regulator.

* * * * *